(12) United States Patent
Kubota

(10) Patent No.: US 12,336,109 B2
(45) Date of Patent: Jun. 17, 2025

(54) CORRECTION AMOUNT CALCULATING DEVICE

(71) Applicant: FUJI CORPORATION, Chiryu (JP)

(72) Inventor: Tomokatsu Kubota, Anjo (JP)

(73) Assignee: FUJI CORPORATION, Chiryu (JP)

( * ) Notice: Subject to any disclaimer, the term of this patent is extended or adjusted under 35 U.S.C. 154(b) by 979 days.

(21) Appl. No.: 17/430,745

(22) PCT Filed: Mar. 5, 2019

(86) PCT No.: PCT/JP2019/008717
§ 371 (c)(1),
(2) Date: Aug. 13, 2021

(87) PCT Pub. No.: WO2020/178991
PCT Pub. Date: Sep. 10, 2020

(65) Prior Publication Data
US 2022/0151120 A1 May 12, 2022

(51) Int. Cl.
*H05K 13/04* (2006.01)
*H05K 13/00* (2006.01)

(52) U.S. Cl.
CPC ..... *H05K 13/0465* (2013.01); *H05K 13/0015* (2013.01); *H05K 13/0061* (2013.01)

(58) Field of Classification Search
CPC ............. G01N 21/956; H05K 13/0015; H05K 13/0061; H05K 13/04; H05K 13/0465; H05K 13/0815; H05K 13/0817; H05K 13/083; H05K 3/34
See application file for complete search history.

(56) References Cited

U.S. PATENT DOCUMENTS

| | | | | |
|---|---|---|---|---|
| 5,541,834 A | * | 7/1996 | Tomigashi | H05K 13/0812 700/59 |
| 11,357,150 B2 | * | 6/2022 | Kondo | H04N 7/183 |
| 2018/0049356 A1 | | 2/2018 | Mori et al. | |

FOREIGN PATENT DOCUMENTS

| | | |
|---|---|---|
| JP | 2012-151251 A | 8/2012 |
| JP | 2013096831 A * | 5/2013 |
| JP | 2018-25481 A | 2/2018 |
| JP | 2018-113336 A | 7/2018 |
| WO | WO 2015/011753 A1 | 1/2015 |
| WO | WO 2018/146839 A1 | 8/2018 |

OTHER PUBLICATIONS

International Search Report mailed on May 28, 2019 in PCT/JP2019/008717 filed on Mar. 5, 2019 (1 page).

* cited by examiner

*Primary Examiner* — Minh N Trinh
(74) *Attorney, Agent, or Firm* — Oblon, McClelland, Maier & Neustadt, L.L.P.

(57) ABSTRACT

A correction amount calculation device includes a selection section and a correction amount calculation section. The selection section is configured to select a target component in which a movement amount of the component on a board before and after being conveyed to a reflow furnace is equal to or less than a predetermined allowable value. The correction amount calculation section is configured to calculate a correction amount, which is used in a mounting process of a board product to be produced later, regarding a positional deviation amount of the mounting position of the target component selected by the selection section with respect to a target mounting position.

9 Claims, 4 Drawing Sheets

Fig. 7B
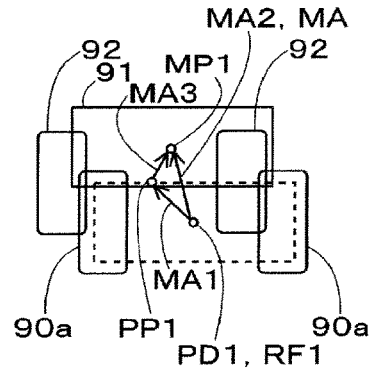
Fig. 8A
| TARGET MOUNTING POSITION RF1 | BOARD IDENTIFICATION INFORMATION ID1 | | |
|---|---|---|---|
| | SYMBOL ID11 | SYMBOL ID12 | ·· |
| SYMBOL R1 | ΔX11, ΔY11 | ΔX12, ΔY12 | ·· |
| SYMBOL R3 | ΔX31, ΔY31 | ΔX32, ΔY32 | ·· |
| : | : | : | : |
Fig. 8B
| COMPONENT TYPE PT1 | BOARD IDENTIFICATION INFORMATION ID1 | | |
|---|---|---|---|
| | SYMBOL ID11 | SYMBOL ID12 | ·· |
| SYMBOL P1 | ΔX11, ΔY11 | ΔX12, ΔY12 | ·· |
| SYMBOL P3 | ΔX31, ΔY31 | ΔX32, ΔY32 | ·· |
| : | : | : | : |
Fig. 9
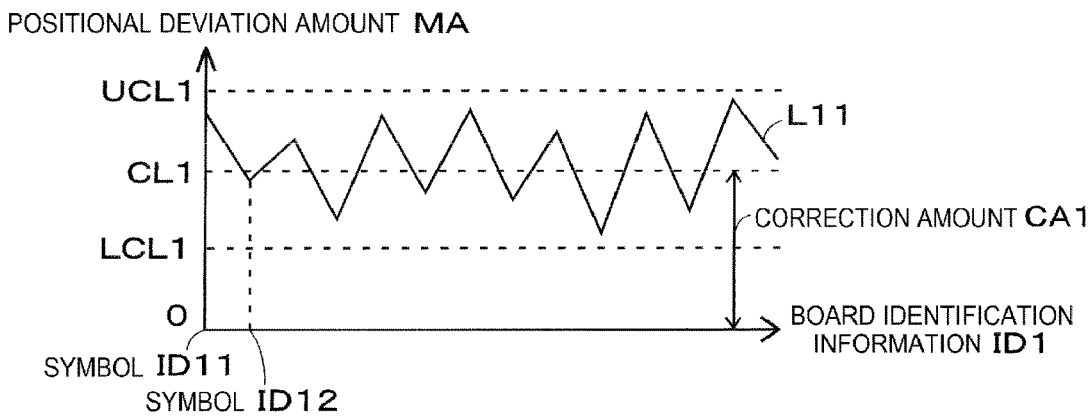

CORRECTION AMOUNT CALCULATING DEVICE

TECHNICAL FIELD

The present description discloses a technique related to a correction amount calculation device and a correction amount calculation method.

BACKGROUND ART

An analyzing device disclosed in Patent Literature 1 estimates a distribution of second measurement values corresponding to a distribution of first measurement values, based on a correlation between the first measurement value in the intermediate inspection and the second measurement value in the final inspection. Then, the analyzing device sets an inspection reference of the first measurement value by using the estimated distribution such that the inspection reference of the first measurement value best matches a determination result of the acceptability based on the second measurement value. It should be noted that in Patent Literature 1, a deviation amount of solder in the inspection after the solder printing is described as an example of the first measurement value, and a deviation amount of a component in the inspection after reflowing is described as an example of the second measurement value.

In a suitability determination method disclosed in Patent Literature 2, it is determined whether a determination reference value used for an intermediate inspection is appropriate based on a relationship between a final inspection for inspecting a final form product formed through multiple steps and the intermediate inspection for inspecting an intermediate product formed in a step prior to the final inspection. Specifically, the suitability determination method includes a step of deriving a correlation between a measurement value for the intermediate product and a measurement value for the final form product, and a step of performing a first calculation process and a second calculation process for each calculation target point.

In the first calculation process, multiple calculation target points are set in a range in which the measurement values for the intermediate product can be distributed, and a distribution pattern of the measurement values of the final form product corresponding to the measurement value indicated by the calculation target point is specified based on the derived correlation. In the second calculation process, based on the relationship between the distribution pattern and the determination reference value used in the final inspection, the probability that the final form product formed from the intermediate product from which the measurement value indicated by the calculation target point is obtained is determined to be a non-defective product or a defective product in the final inspection is obtained.

PATENT LITERATURE

Patent Literature 1: JP-A-2018-025481
Patent Literature 2: JP-A-2012-151251

BRIEF SUMMARY

Technical Problem

When solder melts in a reflow furnace, there is a possibility that a component flows. Therefore, in a board work line in which an appearance inspection machine is provided at a subsequent stage of the reflow furnace, there is a possibility that the appearance inspection machine inspects the component after flowing. Accordingly, in a case in which a correction amount when a component mounting machine mounts the component is calculated for mounting positions of all the components inspected by the appearance inspection machine, it cannot be said that the correction amount is necessarily appropriate.

In view of such circumstances, the present description discloses a correction amount calculation device and a correction amount calculation method capable of selecting the target component and calculating the correction amount when the target component is mounted, for the calculation of the correction amount used in a mounting process of the component mounting machine on the board work line in which the appearance inspection machine is provided in the subsequent stage of the reflow furnace.

Solution to Problem

The present description discloses a correction amount calculation device including, in a board work line including a component mounting machine, a reflow furnace, and an appearance inspection machine, a selection section and a correction amount calculation section. The component mounting machine is configured to perform a mounting process of mounting a component on a board on which solder is printed. The reflow furnace is configured to heat the board on which the component is mounted and melt the solder to perform soldering. The appearance inspection machine is configured to inspect a mounting position of the component, which is subjected to the soldering. The selection section is configured to select a target component in which a movement amount of the component on the board before and after being conveyed to the reflow furnace is equal to or less than a predetermined allowable value. The correction amount calculation section is configured to calculate a correction amount, which is used in the mounting process of a board product to be produced later, regarding a positional deviation amount of the mounting position of the target component selected by the selection section with respect to a target mounting position.

Further, the present description relates to a correction amount calculation method which is applied to a board work line including a component mounting machine, a reflow furnace, and an appearance inspection machine, the method including a selection step and a correction amount calculation step. The component mounting machine is configured to perform a mounting process of mounting a component on a board on which solder is printed. The reflow furnace is configured to heat the board on which the component is mounted and melt the solder to perform soldering. The appearance inspection machine is configured to inspect a mounting position of the component, which is subjected to the soldering. In the selection step, a target component in which a movement amount of the component on the board before and after being conveyed to the reflow furnace is equal to or less than a predetermined allowable value is selected. In the correction amount calculation step, a correction amount, which is used in the mounting process of a board product to be produced later, is calculated regarding a positional deviation amount of the mounting position of the target component selected in the selection step with respect to a target mounting position.

Advantageous Effects

With the correction amount calculation device described above, the selection section and the correction amount calculation section in the board work line in which the appearance inspection machine is provided in the subsequent stage of the reflow furnace. As a result, the correction amount calculation device can select the target component in which the movement amount of the component in the board before and after being conveyed to the reflow furnace is equal to or less than the predetermined allowable value, and calculate the correction amount when the selected target component is mounted. The above description of the correction amount calculation device can be similarly applied to the correction amount calculation method.

BRIEF DESCRIPTION OF DRAWINGS

FIG. 7B is a schematic diagram showing an example of positional deviation amount MA when component 91 is mounted in accordance with pad 90$a$.

FIG. 8A is a schematic diagram showing an example of a state in which board identification information ID1 and positional deviation amount MA for each target mounting position RF1 are stored in association with each other.

FIG. 8B is a schematic diagram showing an example of a state in which board identification information ID1 and positional deviation amount MA for each component type PT1 are stored in association with each other.

FIG. 9 is a schematic diagram showing an example of a distribution of positional deviation amount MA.

DESCRIPTION OF EMBODIMENTS

1. Embodiment 1-1. Configuration Example of Board Work Line WML

Figure 1:
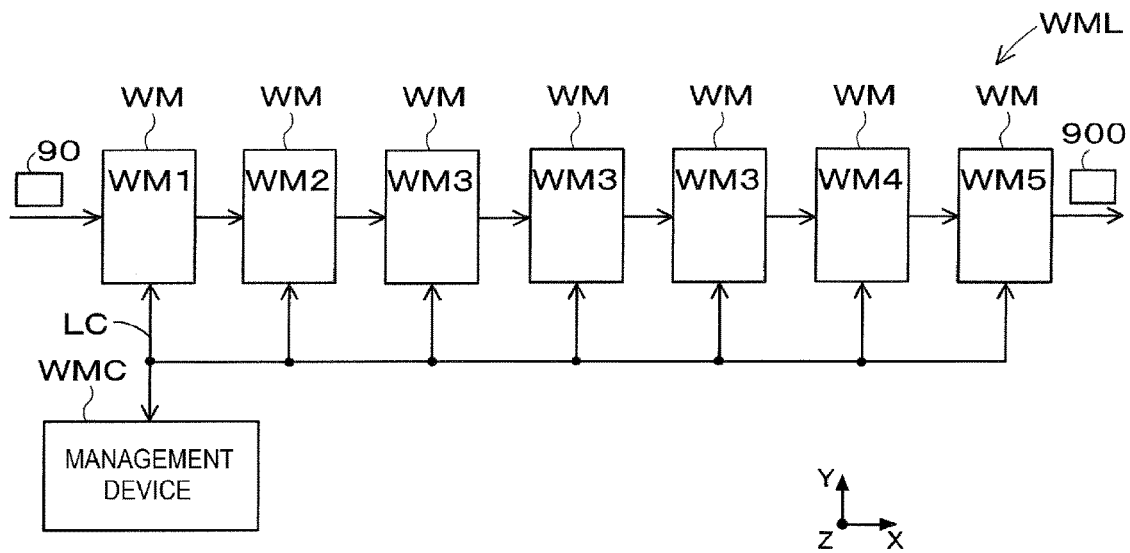
FIG. 1 is a configuration diagram showing a configuration example of board work line WML.

In board work line WML, a predetermined board work is performed with respect to board 90. The type and the number of board work machines WM, which configure board work line WML, are not limited. As shown in FIG. 1, board work line WML of the present embodiment includes multiple (seven) board work machines WM of printing machine WM1, printing inspection machine WM2, multiple (three) component mounting machines WM3, reflow furnace WM4, and appearance inspection machine WM5, and board 90 is conveyed in this order by a board conveyance device (not shown).

Printing machine WM1 prints solder 92 on board 90 at a mounting position of each of multiple components 91. Printing inspection machine WM2 inspects a printing state of solder 92 printed by printing machine WM1. Component mounting machine WM3 performs a mounting process of mounting component 91 to board 90 on which solder 92 is printed. One or multiple component mounting machines WM3 may be provided. As in the present embodiment, in a case in which multiple component mounting machines WM3 are provided, multiple components 91 can be mounted by allocation to multiple component mounting machines WM3.

Reflow furnace WM4 heats board 90 on which component 91 is mounted and melts solder 92 to perform soldering. Appearance inspection machine WM5 inspects a mounting state of soldered component 91. As described above, board work line WML can convey board 90 in order by using multiple (seven) board work machines WM, perform a production process including an inspection process, and produce board product 900. It should be noted that board work line WML can include, as required, board work machine WM such as, for example, a function inspection machine, a buffer device, a board supply device, a board flipping device, a shield mounting device, an adhesive application device, and an ultraviolet irradiation device.

Multiple (seven) board work machines WM, which configure board work line WML, and management device WMC are electrically connected by communication section LC. Specifically, communication section LC can communicably connect multiple (seven) board work machines WM and management device WMC to each other by wired or wireless communication. Further, as a communication method, various methods can be adopted.

In the present embodiment, a local area network (LAN) is formed by multiple (seven) board work machines WM and management device WMC. As a result, multiple (seven) board work machines WM can communicate with each other via communication section LC. Also, multiple (seven) board work machines WM can communicate with management device WMC via communication section LC.

Management device WMC controls multiple (seven) board work machines WM, which configure board work line WML, and monitors an operation status of board work line WML. Various control data for controlling multiple (seven) board work machines WM are stored in management device WMC. Management device WMC transmits the control data to each of multiple (seven) board work machines WM. Each of multiple (seven) board work machines WM transmits the operation status and a production status to management device WMC.

1-2. Configuration Example of Component Mounting Machine WM3

Figure 2:
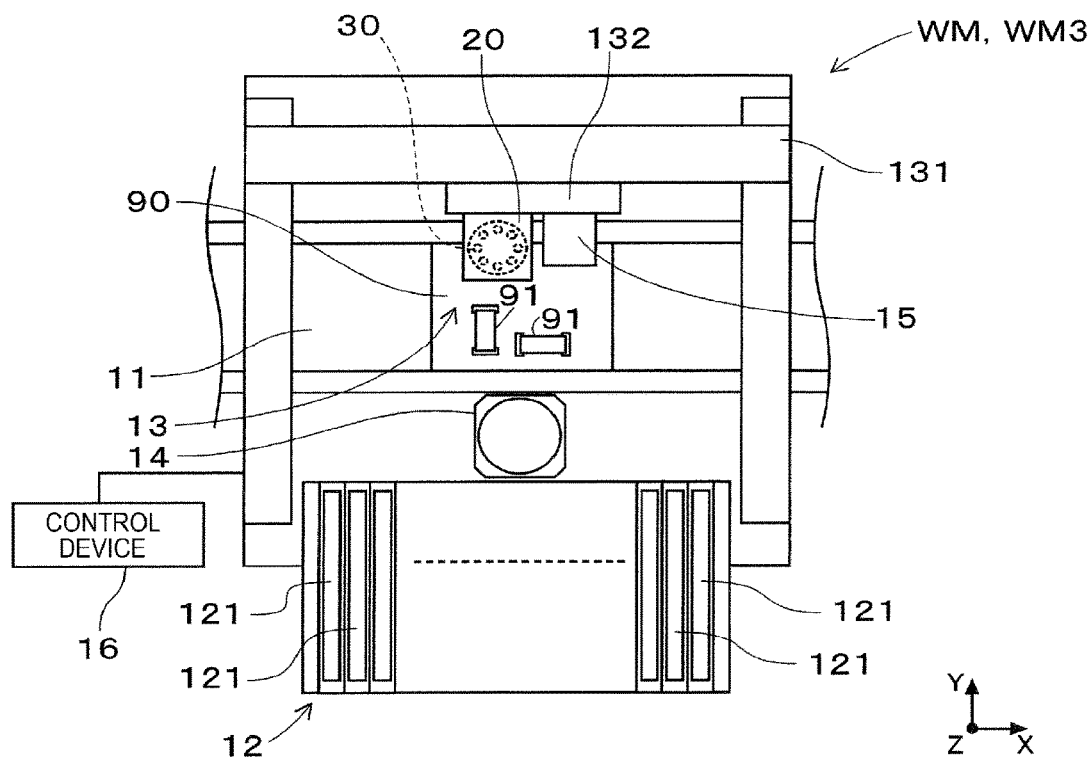
FIG. 2 is a plan view showing a configuration example of component mounting machine WM3.

Component mounting machine WM3 performs a mounting process of mounting component 91 to board 90 on which solder 92 is printed. As shown in FIG. 2, component mounting machine WM3 includes board conveyance device 11, component supply device 12, component transfer device 13, part camera 14, board camera 15, and control device 16.

Board conveyance device 11 includes, for example, a belt conveyor or the like, and conveys board 90 in a conveyance direction (X-axis direction). Board 90 is a circuit board, and at least one of an electronic circuit and an electrical circuit is formed thereon. Board conveyance device 11 conveys board 90 to the inside of component mounting machine WM3, and positions board 90 at a predetermined position inside the machine. After the mounting process of component 91 by component mounting machine WM3 is completed, board conveyance device 11 conveys board 90 to the outside of component mounting machine WM3.

Component supply device 12 supplies multiple components 91 to be mounted on board 90. Component supply device 12 includes multiple feeders 121 which are provided along the conveyance direction of board 90 (X-axis direction). Each of multiple feeders 121 pitch-feeds a carrier tape (not shown) which stores multiple components 91 to supply component 91 so that component 91 can be picked up at a supply position located on a distal end side of feeder 121. Also, component supply device 12 can supply relatively large electronic components (for example, lead components) as compared with chip components or the like, in a state of being disposed on a tray.

Component transfer device 13 includes head driving device 131 and moving body 132. Head driving device 131 is configured to move moving body 132 in the X-axis direction and the Y-axis direction by a linear motion mechanism. Mounting head 20 is detachably (exchangeably) mounted on moving body 132 by a clamp member (not shown). Mounting head 20 picks up and holds component 91 supplied by component supply device 12 by using at least one holding member 30, and mounts component 91 on board 90 positioned by board conveyance device 11. As holding member 30, for example, a suction nozzle, a chuck, or the like can be used.

As part camera 14 and board camera 15, a well-known imaging device can be used. Part camera 14 is fixed to a base of component mounting machine WM3 such that an optical axis thereof is directed upward (vertical upward direction) in a Z-axis direction. Part camera 14 can image component 91 held by holding member 30 from below.

Board camera 15 is provided in moving body 132 of component transfer device 13 such that an optical axis thereof is directed downward in the Z-axis direction (vertical downward direction). Board camera 15 can capture an image of board 90 from above. Part camera 14 and board camera 15 perform imaging based on control signals transmitted from control device 16. Image data captured by part camera 14 and board camera 15 is transmitted to control device 16.

Control device 16 includes well-known computing device and storage device, and a control circuit is provided therein (both of which are not shown). The information, the image data, and the like output from various sensors provided in component mounting machine WM3 are input to control device 16. Control device 16 transmits the control signals to each device based on a control program, a predetermined mounting condition, which is set in advance, and the like.

For example, control device 16 causes board camera 15 to image board 90 which is positioned by board conveyance device 11. Control device 16 performs image processing on the image captured by board camera 15 to recognize a positioning state of board 90. Also, control device 16 causes holding member 30 to pick up and hold component 91 supplied by component supply device 12, and causes part camera 14 to image component 91 held by holding member 30. Control device 16 performs the image processing on the image captured by part camera 14 to recognize a holding posture of component 91.

Control device 16 moves holding member 30 toward above a scheduled mounting position, which is set in advance by the control program or the like. Further, based on the positioning state of board 90, the holding posture of component 91, and the like, control device 16 corrects the scheduled mounting position to set the mounting position on which component 91 is actually mounted. The scheduled mounting position and the mounting position include a rotation angle in addition to the position (X-axis coordinate and Y-axis coordinate).

Control device 16 corrects a target position (X-axis coordinate and Y-axis coordinate) of holding member 30 and the rotation angle in accordance with the mounting position. Control device 16 lowers holding member 30 at the corrected rotation angle at the corrected target position to mount component 91 on board 90. Control device 16 repeats the pick-and-place cycle to perform the mounting process of mounting multiple components 91 on board 90.

1-3. Correction Amount Calculation Device 40 and Component Mounting Machine WM3

Correction amount calculation device 40 includes selection section 41 and correction amount calculation section 42, as a control block. It is preferable that correction amount calculation device 40 further include permission section 43. In addition, it is preferable that component mounting machine WM3 include mounting process section 44. It should be noted that permission section 43 can be provided in component mounting machine WM3.

Figure 3:
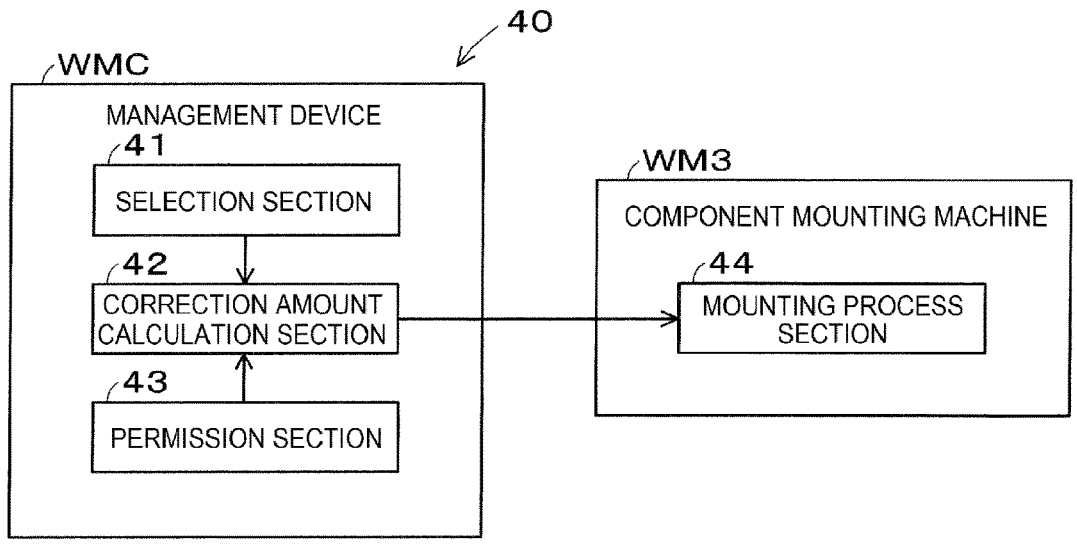
FIG. 3 is a block diagram showing an example of a control block of correction amount calculation device 40.

As shown in FIG. 3, correction amount calculation device 40 of the present embodiment includes selection section 41, correction amount calculation section 42, and permission section 43. As shown in FIG. 3, correction amount calculation device 40 of the present embodiment is provided in management device WMC. Correction amount calculation device 40 can be provided in various computing devices other than management device WMC.

Figure 4:
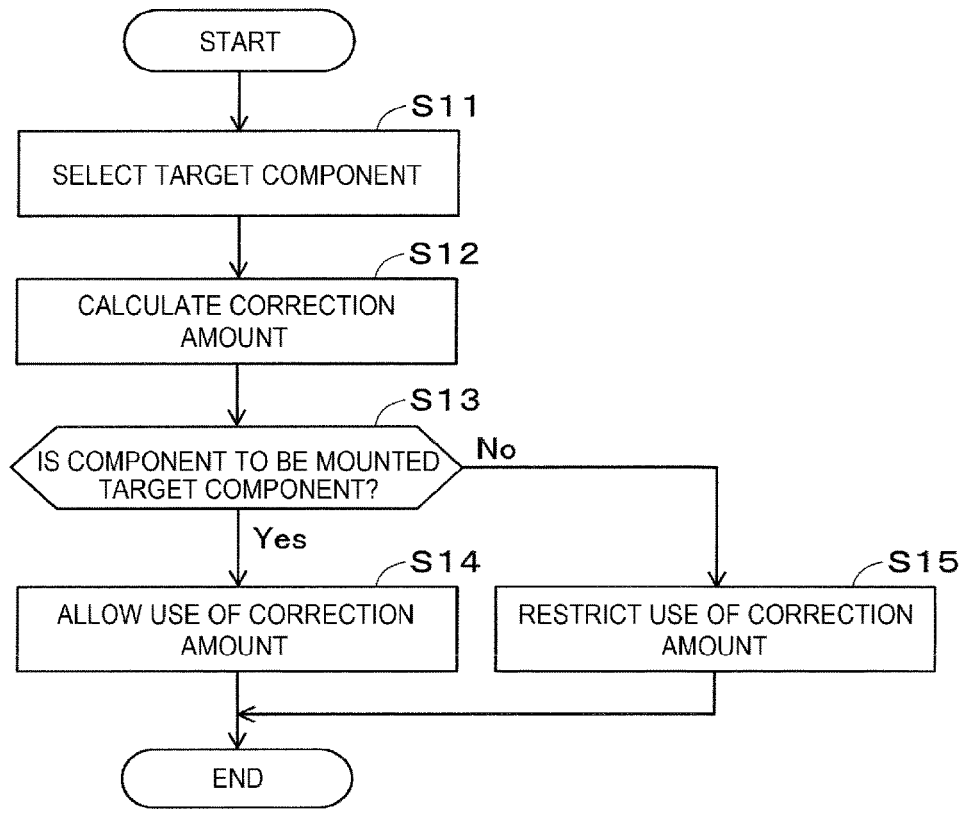
FIG. 4 is a flowchart showing an example of a control procedure by management device WMC.
Figure 5:
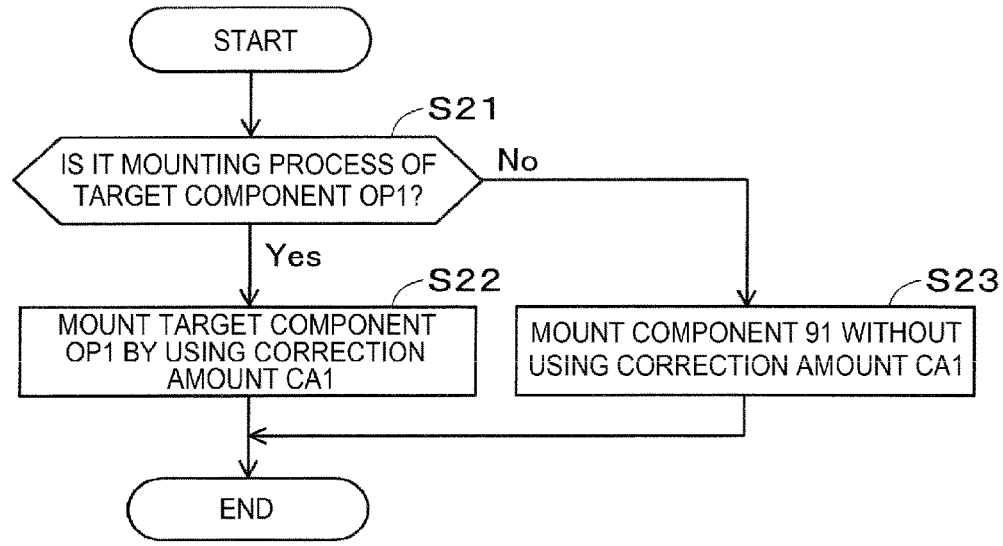
FIG. 5 is a flowchart showing an example of a control procedure by component mounting machine WM3.

Management device WMC executes the control program according to a flowchart shown in FIG. 4. Selection section 41 performs a process shown in step S11. Correction amount calculation section 42 performs a process shown in step S12. Permission section 43 performs determination shown in step S13 and processes shown in steps S14 and S15. In addition, component mounting machine WM3 executes the control program according to a flowchart shown in FIG. 5. Mounting process section 44 performs determination shown in step S21 and processes shown in steps S22 and S23.

1-3-1. Selection Section 41

When solder 92 melts in reflow furnace WM4, there is a possibility that component 91 flows. Therefore, as in the present embodiment, in board work line WML in which appearance inspection machine WM5 is provided at a subsequent stage of reflow furnace WM4, there is a possibility that appearance inspection machine WM5 inspects component 91 after flowing. Accordingly, in a case in which correction amount CA1 when component mounting machine WM3 mounts component 91 is calculated for mounting positions MP1 of all components 91 inspected by appearance inspection machine WM5, it cannot be said that correction amount CA1 is necessarily appropriate. Accordingly, correction amount calculation device 40 of the present embodiment includes selection section 41.

Selection section 41 selects target component OP1 in which a movement amount of component 91 in board 90 before and after being conveyed to reflow furnace WM4 is equal to or less than a predetermined allowable value (step S11 shown in FIG. 4). It is preferable that the predetermined allowable value be zero. That is, it is preferable that selection section 41 select, as target component OP1, component 91 of which the movement amount is zero.

The predetermined allowable value may be a predetermined value (predetermined value approximating zero) that satisfies the required mounting accuracy of component 91. That is, selection section 41 is also allowed to select, as target component OP1, component 91 of which the movement amount is not zero. It should be noted that in a case in which component type PT1 of component 91 is different, the presence or absence of movement and the movement amount of component 91 change, and thus selection section 41 preferably selects target component OP1 for each component type PT1 of component 91.

The size of component 91 increases as the volume of component 91 increases, and component 91 is less likely to flow when solder 92 melts in reflow furnace WM4. The above description can be similarly applied to the size of component 91. In addition, as the mass of component 91 increases, component 91 is less likely to flow when solder 92 melts in reflow furnace WM4.

Accordingly, it is preferable that selection section 41 select, as target component OP1, component 91 of which at least one of the volume, the mass, and the size of component 91 is equal to or more than a predetermined threshold value. As a result, selection section 41 can select target component OP1 based on at least one of the volume, the mass, and the size of component 91.

The predetermined threshold value can be defined in the same manner as the predetermined allowable value. That is, the predetermined threshold value can be set to, for example, a threshold value as to whether the movement amount of component 91 is zero (for example, a minimum value of the volume of component 91 at which the movement amount is zero). The predetermined threshold value may be, for example, a predetermined value that satisfies required mounting accuracy of component 91.

In addition, a user of component mounting machine WM3 may obtain the movement of component 91 through the actual production of board product 900. Accordingly, it is preferable that selection section 41 select, as target component OP1, component 91 designated by the user of component mounting machine WM3. As a result, selection section 41 can select target component OP1 based on the designation by the user of component mounting machine WM3.

Component mounting machine WM3 of the present embodiment includes a display device (not shown). The display device includes, for example, a touch panel, and the display device also serves as an input device which receives various operations by the user of component mounting machine WM3. Selection section 41 causes the display device to display a list of components 91 to be mounted on board 90 such that the user can designate desired component 91 as target component OP1 by using, for example, the touch panel. It should be noted that the user of component mounting machine WM3 can also designate, as target component OP1, component 91 in which at least one of the volume, the mass, and the size of component 91 is equal to or more than the predetermined threshold value.

In addition, selection section 41 may measure the movement amount of component 91 before and after being conveyed to reflow furnace WM4 and select, as target component OP1, component 91 of which the movement amount is equal to or less than the predetermined allowable value. As a result, selection section 41 can select target component OP1 based on an actual movement amount of component 91.

The measurement of the movement amount of component 91 can be performed before the production of board product 900 is started. As for the measurement of the movement amount of component 91, for example, board work line WML for testing, which includes appearance inspection machine WM5 in each of a preceding stage and the subsequent stage of reflow furnace WM4, can be used. In this case, appearance inspection machine WM5 can inspect mounting position MP1 of component 91 before and after being conveyed to reflow furnace WM4. The movement amount of component 91 corresponds to a difference between mounting positions MP1 of component 91 before and after being conveyed to reflow furnace WM4.

The measurement of the movement amount of component 91 can also be performed during the production of board product 900. In this case, component mounting machine WM3 preferably includes, for example, an imaging device having a wider field of view than board camera 15 shown in FIG. 2. Component mounting machine WM3 can cause the imaging device to image board 90, perform image processing on the acquired image, and acquire mounting position MP1 of component 91 before being conveyed to reflow furnace WM4. In addition, appearance inspection machine WM5 can inspect mounting position MP1 of soldered component 91 after being conveyed out from reflow furnace WM4. As a result, selection section 41 can acquire mounting position MP1 of component 91 before and after being conveyed to reflow furnace WM4, and can measure the movement amount of component 91 in the same manner.

Further, selection section 41 may select target component OP1 based on the distribution of the movement amounts of component 91 before and after being conveyed to reflow furnace WM4 acquired in the past. As a result, selection section 41 can select target component OP1 based on the distribution of the movement amounts of component 91.

For example, before shipment of board work line WML, various data are acquired by using multiple boards 90 of the same type in order to confirm the accuracy of each device. Selection section 41 acquires, for example, the variation in positional deviation amount MA of component 91 (the deviation between target mounting position RF1 and actual mounting position MP1) mounted by component mounting machine WM3, for each component type PT1, by using the data. The variation in positional deviation amount MA in this case is defined as a first distribution.

In addition, selection section 41 acquires the variation in positional deviation amount MA of component 91 (the deviation between target mounting position RF1 and actual mounting position MP1) inspected by appearance inspection machine WM5, for each component type PT1, by using the data. The variation in positional deviation amount MA in this case is defined as a second distribution. Selection section 41 can determine that the movement amount of component 91 is equal to or less than the predetermined allowable value when the first distribution and the second distribution are approximate to each other (when the difference between the average values of two distributions is within the predetermined value) and select component 91 as target component OP1.

Selection section 41 can determine that the movement amount of component 91 exceeds the predetermined allowable value when the second distribution is close to target mounting position RF1 (for example, when the difference between the average value of the first distribution and target mounting position RF1 exceeds the predetermined value, and the difference between the average value of the second distribution and target mounting position RF1 is within the predetermined value). In this case, selection section 41 does not select component 91 as target component OP1.

Figure 6:
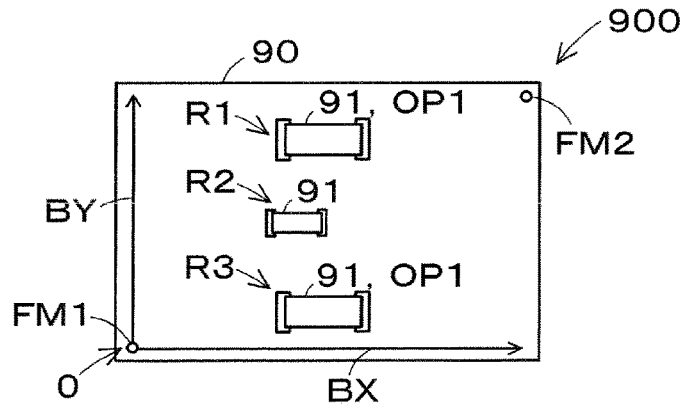
FIG. 6 is a schematic diagram showing an example of board product 900.

FIG. 6 shows an example of board product 900. As shown in FIG. 6, first mark portion FM1 and second mark portion FM2 are provided on board 90. First mark portion FM1 and second mark portion FM2 are positioning references of board 90, which are called fiducial marks, and are provided in an outer edge part of board 90. A board coordinate system, which is a coordinate system set on board 90, can be defined by a positional relationship between first mark portion FM1 and second mark portion FM2, and X-axis direction BX and Y-axis direction BY.

In the present embodiment, origin O of the board coordinate system is provided in first mark portion FM1. For example, control device 16 of component mounting machine WM3 shown in FIG. 2 can cause board camera 15 to image first mark portion FM1 and second mark portion FM2, perform the image processing on the acquired images, acquire the position and the angle of board 90 to obtain the board coordinate system. Also, target mounting position RF1 of each of multiple (three in FIG. 6, for convenience of illustration) components 91 on board 90 can be represented by using the board coordinate system. In FIG. 6, target mounting position RF1 is represented by symbols R1 to R3.

For example, it is supposed that component 91 to be mounted at a position in which target mounting position RF1 is indicated by symbol R1 is component 91 in which the volume of component 91 is equal to or more than the predetermined threshold value. Further, it is supposed that component 91 to be mounted at a position in which target mounting position RF1 is indicated by symbol R2 is component 91 in which the volume of component 91 is less than the predetermined threshold value. In addition, it is supposed that component 91 to be mounted at a position in which target mounting position RF1 is indicated by symbol R3 is component 91 in which the volume of component 91 is equal to or more than the predetermined threshold value.

In this case, selection section 41 selects, as target component OP1, component 91 to be mounted at the position in which target mounting position RF1 is indicated by symbol R1 and component 91 to be mounted at the position in which target mounting position RF1 is indicated by symbol R3. It should be noted that selection section 41 does not select, as target component OP1, component 91 to be mounted at the position in which target mounting position RF1 is indicated by symbol R2.

1-3-2. Correction Amount Calculation Section 42

Correction amount calculation section 42 calculates correction amount CA1, which is used in the mounting process of board product 900 to be produced later, regarding positional deviation amount MA of mounting position MP1 of target component OP1 selected by selection section 41 with respect to target mounting position RF1 (step S12 shown in FIG. 4).

Figure 7A:
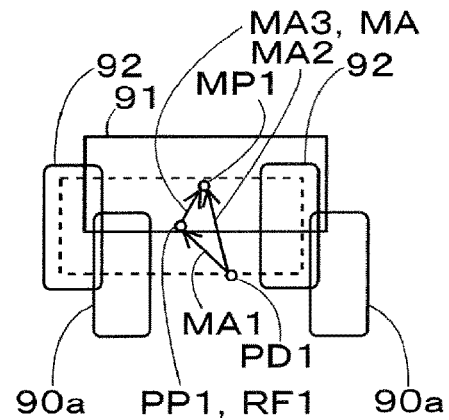
FIG. 7A is a schematic diagram showing an example of positional deviation amount MA when component 91 is mounted in accordance with solder 92.

FIG. 7A shows an example of positional deviation amount MA when component 91 is mounted in accordance with solder 92. FIG. 7B shows an example of positional deviation amount MA when component 91 is mounted in accordance with pad 90a. FIGS. 7A and 7B show examples of the positional relationship among pad 90a formed on board 90, solder 92 printed by printing machine WM1, and component 91 mounted by component mounting machine WM3, for one component 91 among multiple (three) components 91 shown in FIG. 6.

Pad 90a is also called a land, and is formed in a wiring pattern of the circuit. For example, component 91 shown in FIG. 6 includes two electrode portions, and two pads 90a are provided for one component 91. Solder 92 electrically connects pad 90a and the electrode portions of component 91. Ideally, printing machine WM1 prints solder 92 on pad 90a and component mounting machine WM3 mounts component 91 on solder 92. However, printing position PP1 of solder 92 and mounting position MP1 of component 91 have a possibility of deviating from the target position due to various factors such as a positioning error of board 90 and an operation error of the device.

Here, a centroid position of multiple (two in FIG. 7) pads 90a provided for one component 91 is defined as pad position PD1. In addition, a centroid position of multiple (two in FIG. 7) solders 92 printed on board 90 for component 91 is defined as printing position PP1. Further, a centroid position of component 91 when component 91 is mounted on board 90 is defined as mounting position MP1.

In addition, a positional deviation amount of printing position PP1 detected by printing inspection machine WM2 with respect to pad position PD1 is defined as first positional deviation amount MA1. In addition, a positional deviation amount of mounting position MP1 detected by appearance inspection machine WM5 with respect to pad position PD1 is defined as second positional deviation amount MA2. In addition, the positional deviation amount of mounting position MP1 with respect to printing position PP1 is defined as third positional deviation amount MA3.

Surface tension is generated when solder 92 printed on board 90 melts. Since the surface tension is greatest at a center part of pad 90a, in a case in which component 91 is mounted in accordance with solder 92, component 91 and solder 92 flow together toward pad 90a when solder 92 melts in reflow furnace WM4, and the electrode portions of component 91 are drawn to the center part of pad 90a.

Accordingly, in component mounting machine WM3, component 91 may be mounted in accordance with solder 92 printed on board 90 (see the square indicated by the dashed line in FIG. 7A). In this case, target mounting position RF1 of component 91 is printing position PP1, and positional deviation amount MA of mounting position MP1 of component 91 with respect to target mounting position RF1 corresponds to third positional deviation amount MA3. It should be noted that first positional deviation amount MA1 indicates a deviation between a target printing position (pad position PD1) of solder 92 and actual printing position PP1.

First positional deviation amount MA1 is detected by printing inspection machine WM2. Printing inspection machine WM2 inspects printing position PP1 of solder 92 printed by printing machine WM1. For example, printing inspection machine WM2 can cause the imaging device to image board 90, perform the image processing on the acquired image, acquire the position and the angle of board 90 based on first mark portion FM1 and second mark portion FM2 to obtain the board coordinate system.

In addition, printing inspection machine WM2 can perform the image processing on the acquired image to acquire a coordinate value of printing position PP1 of solder 92. Printing inspection machine WM2 can detect first positional deviation amount MA1 from the deviation between the acquired coordinate value of printing position PP1 and a known coordinate value of pad position PD1. Printing inspection machine WM2 detects first positional deviation amount MA1 for each of the X-coordinate and the Y-coordinate.

Second positional deviation amount MA2 is detected by appearance inspection machine WM5. Appearance inspection machine WM5 inspects mounting position MP1 of soldered component 91. Target component OP1 is component 91 in which the movement amount of component 91 on board 90 before and after being conveyed to reflow furnace WM4 is equal to or less than the predetermined allowable value. Accordingly, second positional deviation amount MA2 of target component OP1 before and after being conveyed to reflow furnace WM4 is less likely to change.

Accordingly, appearance inspection machine WM5 can inspect, for target component OP1, mounting position MP1 of component 91 mounted by component mounting machine WM3. For example, appearance inspection machine WM5 can cause the imaging device to image board 90, perform the image processing on the acquired image, acquire the position and the angle of board 90 based on first mark portion FM1 and second mark portion FM2 to obtain the board coordinate system.

In addition, appearance inspection machine WM5 can perform the image processing on the acquired image to acquire a coordinate value of mounting position MP1 of target component OP1. Appearance inspection machine WM5 can detect second positional deviation amount MA2 from the deviation between the acquired coordinate value of mounting position MP1 and a known coordinate value of pad position PD1. Appearance inspection machine WM5 detects second positional deviation amount MA2 for each of the X-coordinate and the Y-coordinate. It should be noted that printing inspection machine WM2 acquires first positional deviation amount MA1 for each target mounting position RF1. In addition, appearance inspection machine WM5 acquires second positional deviation amount MA2 for each target mounting position RF1.

Positional deviation amount MA (third positional deviation amount MA3) of mounting position MP1 of target component OP1 with respect to target mounting position RF1 can be calculated based on first positional deviation amount MA1 and second positional deviation amount MA2. Specifically, third positional deviation amount MA3 in X-axis direction BX can be calculated by subtracting first positional deviation amount MA1 in X-axis direction BX from second positional deviation amount MA2 in X-axis direction BX. Third positional deviation amount MA3 in Y-axis direction BY can be calculated by subtracting first positional deviation amount MA1 in Y-axis direction BY from second positional deviation amount MA2 in Y-axis direction BY.

Accordingly, correction amount calculation section 42 can calculate, for target component OP1, correction amount CA1 in X-axis direction BX by subtracting second positional deviation amount MA2 in X-axis direction BX from first positional deviation amount MA1 in X-axis direction BX. Further, correction amount calculation section 42 can calculate, for target component OP1, correction amount CA1 in Y-axis direction BY by subtracting second positional deviation amount MA2 in Y-axis direction BY from first positional deviation amount MA1 in Y-axis direction BY. It should be noted that correction amount calculation section 42 calculates correction amount CA1 for each target mounting position RF1.

In a case in which component mounting machine WM3 mounts component 91 in accordance with pad 90a (see the square indicated by the dashed line in FIG. 7B), target mounting position RF1 of component 91 is pad position PD1, and positional deviation amount MA of mounting position MP1 of component 91 with respect to target mounting position RF1 corresponds to second positional deviation amount MA2. As described above, second positional deviation amount MA2 of target component OP1 can be detected by appearance inspection machine WM5.

In this case, correction amount calculation section 42 can calculate, for target component OP1, correction amount CA1 in X-axis direction BX by inverting the positive and negative of second positional deviation amount MA2 in X-axis direction BX (subtracting second positional deviation amount MA2 in X-axis direction BX from zero). In addition, correction amount calculation section 42 can calculate, for target component OP1, correction amount CA1 in Y-axis direction BY by inverting the positive and negative of second positional deviation amount MA2 in Y-axis direction BY (subtracting second positional deviation amount MA2 in Y-axis direction BY from zero). Also in this case, correction amount calculation section 42 calculates correction amount CA1 for each target mounting position RF1.

As described above, correction amount calculation section 42 can calculate correction amount CA1 based on one board 90. However, positional deviation amount MA of mounting position MP1 of target component OP1 with respect to target mounting position RF1 has a possibility of varying among multiple boards 90 due to various factors such as the positioning error of board 90 and the operation error of the device.

Accordingly, it is preferable that correction amount calculation section 42 store board identification information ID1 for identifying board 90 and positional deviation amount MA for each target mounting position RF1 of target component OP1 to be mounted on board 90 in association with each other, for multiple boards 90 of the same type. In addition, it is preferable that correction amount calculation section 42 calculate correction amount CA1 for each target mounting position RF1 based on the distribution of a predetermined number of positional deviation amounts MA for each target mounting position RF1. As a result, correction amount calculation section 42 can calculate correction amount CA1 for each target mounting position RF1 in consideration of the variation in positional deviation amount MA among multiple boards 90.

Management device WMC shown in FIG. 1 includes a well-known storage device. In a case in which component mounting machine WM3 mounts component 91 in accordance with solder 92, printing inspection machine WM2 transmits, to management device WMC, board identification information ID1 of board 90 and first positional deviation amount MA1 for each detected target mounting position RF1 in association with each other, for target component OP1. Similarly, appearance inspection machine WM5 transmits, to management device WMC, board identification information ID1 of board 90 and second positional deviation amount MA2 for each detected target mounting position RF1 in association with each other, for target component OP1.

Correction amount calculation section 42 calculates, for target component OP1, third positional deviation amount MA3 for each target mounting position RF1 based on first positional deviation amount MA1 and second positional deviation amount MA2 for each target mounting position RF1, which are associated with same board identification information ID1. Then, correction amount calculation section 42 stores, in the storage device, board identification information ID1 of board 90 and third positional deviation amount MA3 for each target mounting position RF1 in association with each other, for target component OP1. As described above, third positional deviation amount MA3 corresponds to positional deviation amount MA of mounting position MP1 of target component OP1 with respect to target mounting position RF1.

In a case in which component mounting machine WM3 mounts component 91 in accordance with pad 90a, appearance inspection machine WM5 transmits, to management device WMC, board identification information ID1 of board 90 and second positional deviation amount MA2 for each detected target mounting position RF1 in association with each other, for target component OP1. Correction amount calculation section 42 stores, in the storage device, board identification information ID1 of board 90 and second positional deviation amount MA2 for each target mounting position RF1 in association with each other, for target component OP1. As described above, second positional deviation amount MA2 corresponds to positional deviation amount MA of mounting position MP1 of target component OP1 with respect to target mounting position RF1.

FIG. 8A shows an example of a state in which board identification information ID1 and positional deviation amount MA for each target mounting position RF1 are stored in association with each other. Symbol ID11 indicates board identification information ID1 of first board 90 of multiple boards 90 of the same type. Similarly, symbol ID12 indicates board identification information ID1 of second board 90 of multiple boards 90 of the same type.

In the example shown in FIG. 6, selection section 41 selects, as target component OP1, component 91 to be mounted at the position in which target mounting position RF1 is indicated by symbol R1 and component 91 to be mounted at the position in which target mounting position RF1 is indicated by symbol R3. Accordingly, as target mounting position RF1, symbol R1 and symbol R3 are shown, and symbol R2 is not shown.

For example, in board 90 in which board identification information ID1 is indicated by symbol ID11, positional deviation amount MA of X-axis direction BX when component 91 is mounted at the position in which target mounting position RF1 is indicated by symbol R1 is represented by deviation $\Delta X11$. Similarly, in board 90 in which board identification information ID1 is indicated by symbol ID11, positional deviation amount MA of Y-axis direction BY when component 91 is mounted at the position in which target mounting position RF1 is indicated by symbol R1 is represented by deviation $\Delta Y11$. The above description can be similarly applied to another board identification information ID1 and target mounting position RF1 indicated by symbol R3.

In addition, correction amount calculation section 42 may store, for multiple boards 90 of the same type, board identification information ID1 for identifying board 90 and positional deviation amount MA for each component type PT1 of target component OP1 to be mounted on board 90 in association with each other. Correction amount calculation section 42 may calculate correction amount CA1 for each component type PT1 based on the distribution of the predetermined number of positional deviation amounts MA for each component type PT1. As a result, correction amount calculation section 42 can calculate correction amount CA1 for each component type PT1 in consideration of the variation in positional deviation amount MA among multiple boards 90.

Correction amount calculation section 42 can store, in the storage device, board identification information ID1 of board 90 and positional deviation amount MA for each component type PT1 in association with each other, for target component OP1, in the same manner as in the case in which positional deviation amount MA for each target mounting position RF1 is stored. It should be noted that in a case in which multiple target components OP1 having same component type PT1 are mounted on one board 90, correction amount calculation section 42 can store, in the storage device, positional deviation amounts MA for all or a part of target components OP1.

FIG. 8B shows an example of a state in which board identification information ID1 and positional deviation amount MA for each component type PT1 are stored in association with each other. FIG. 8B is different from FIG. 8A in that target mounting position RF1 is changed to component type PT1. Symbol P1 and symbol P3 indicate component type PT1 of target component OP1 selected by selection section 41. Therefore, the above description of target mounting position RF1 based on FIG. 8A can be similarly applied to component type PT1 by replacing target mounting position RF1 with component type PT1. It should be noted that although positional deviation amounts MA in FIGS. 8A and 8B coincide for convenience of illustration, positional deviation amounts MA in FIGS. 8A and 8B may be different.

It is preferable that correction amount calculation section 42 calculate correction amount CA1 when it is determined that the distribution of positional deviation amount MA is in a management state by using the Shewhart control chart. As a result, correction amount calculation section 42 can easily calculate correction amount CA1 in consideration of the variation in positional deviation amount MA among multiple boards 90.

The Shewhart control chart is used, for example, to determine whether a measurement value is in a managed stable state (management state). In the Shewhart control chart, it is determined that the measurement value is in the management state when the measurement value does not exhibit a peculiar distribution. FIG. 9 shows an example of the distribution of positional deviation amount MA. The horizontal axis in the FIG. 9 indicates board identification information ID1, and the vertical axis indicates positional deviation amount MA. Polygonal line L11 can be generated by plotting positional deviation amount MA for each board identification information ID1 for multiple boards 90 of the same type. Polygonal line L11 can be generated for each of positional deviation amount MA in X-axis direction BX and positional deviation amount MA in Y-axis direction BY.

Dashed line CL1 indicates, for example, an average value of multiple positional deviation amounts MA. Dashed line UCL1 indicates a management upper limit value, and dashed line LCL1 indicates a management lower limit value. The management upper limit value can be calculated, for example, by adding a standard deviation of three times to the average value of multiple positional deviation amounts MA. The management lower limit value can be calculated, for example, by subtracting a standard deviation of three times from the average value of multiple positional deviation amounts MA.

Correction amount calculation section 42 can determine that the distribution of positional deviation amounts MA is in the management state when the predetermined number of positional deviation amounts MA are equal to or more than the management lower limit value indicated by dashed line LCL1 and equal to or less than the management upper limit value indicated by dashed line UCL1. Conversely, correction amount calculation section 42 can determine that the distribution of positional deviation amounts MA is not in the management state when at least one positional deviation amount MA among the predetermined number of positional deviation amounts MA exceeds the management upper limit value.

Similarly, correction amount calculation section 42 can determine that the distribution of positional deviation amounts MA is not in the management state when at least one positional deviation amount MA among the predetermined number of positional deviation amounts MA is less than the management lower limit value. In addition, a region between dashed line UCL1 and dashed line CL1 is defined as a positive side region, and a region between dashed line CL1 and dashed line LCL1 is defined as a negative side region.

Correction amount calculation section 42 can also determine that the distribution of positional deviation amounts MA is not in the management state when although the predetermined number of positional deviation amounts MA are equal to or more than the management lower limit value indicated by dashed line LCL1 and equal to or less than the management upper limit value indicated by dashed line UCL1, the distribution of a considerable number of positional deviation amounts MA is abnormal. For example, correction amount calculation section 42 can determine that the distribution of positional deviation amount MA is abnormal when the considerable number of positional deviation amounts MA are continuously distributed in the same region of the positive side region or the negative side region and the variation width of the considerable number of positional deviation amounts MA is small compared with a predetermined variation width.

As described above, correction amount calculation section 42 can calculate the average value of multiple positional deviation amounts MA indicated by dashed line CL1 as correction amount CA1 when it is determined that the distribution of positional deviation amounts MA is in the management state by using the Shewhart control chart. In addition, each time positional deviation amount MA is acquired, correction amount calculation section 42 can acquire the distribution of the predetermined number of positional deviation amounts MA to calculate correction amount CA1 in consideration of the variation in positional deviation amount MA among multiple boards 90. Correction amount calculation section 42 can improve the calculation accuracy of correction amount CA1 by regularly repeating the process.

1-3-3. Permission Section 43

Permission section 43 allows the use of correction amount CA1 calculated by correction amount calculation section 42 when the mounting process of target component OP1 is performed, and restricts the use of correction amount CA1 calculated by correction amount calculation section 42 when the mounting process of component 91, which is not target component OP1, is performed (steps S13 to S15 shown in FIG. 4).

As a result, correction amount calculation device 40 can allow or restrict the use of correction amount CA1 calculated by correction amount calculation section 42, depending on whether component 91 to be subjected to the mounting process is target component OP1. The above description can be similarly applied to a case in which permission section 43 is provided in component mounting machine WM3. A result of determination by permission section 43 and correction amount CA1 calculated by correction amount calculation section 42 are transmitted to component mounting machine WM3.

Permission section 43 determines whether component 91 to be mounted is target component OP1, for example, based on a production plan of board product 900 (step S13). In a case in which component 91 to be mounted is target component OP1 (Yes in step S13), permission section 43 allows the use of correction amount CA1 calculated by correction amount calculation section 42 (step S14). In a case in which component 91 to be mounted is not target component OP1 (No in step S13), permission section 43 restricts the use of correction amount CA1 calculated by correction amount calculation section 42 (step S15).

1-3-4. Mounting Process Section 44

Mounting process section 44 controls the mounting process of mounting component 91 on board 90. Mounting process section 44 is provided in control device 16 of component mounting machine WM3 shown in FIG. 2. Mounting process section 44 can switch the mounting process, for example, depending on whether component 91 to be subjected to the mounting process is target component OP1 (steps S21 to S23 shown in FIG. 5).

In this case, mounting process section 44 determines whether it is the mounting process of target component OP1 (step S21). In the case in which it is the mounting process of target component OP1 (Yes in step S21), mounting process section 44 performs the mounting process by using correction amount CA1 calculated by correction amount calculation section 42 (step S22).

Specifically, mounting process section 44 adds correction amount CA1 of X-axis direction BX calculated by correction amount calculation section 42 to the X-coordinate of target mounting position RF1 of target component OP1 to set the X-coordinate of scheduled mounting position in the mounting process. In addition, mounting process section 44 adds correction amount CA1 in Y-axis direction BY calculated by correction amount calculation section 42 to the Y-coordinate of target mounting position RF1 of target component OP1 to set the Y-coordinate of scheduled mounting position in the mounting process.

In a case in which it is not the mounting process of target component OP1 (No in step S21), mounting process section 44 performs the mounting process without using correction amount CA1 calculated by correction amount calculation section 42 (step S23). In this case, mounting process section 44 sets, for component 91 other than target component OP1, target mounting position RF1 of component 91 to the scheduled mounting position in the mounting process.

Each time correction amount CA1 is calculated by correction amount calculation section 42, mounting process section 44 can also change the scheduled mounting position in the mounting process of target component OP1. Mounting process section 44 can improve the mounting accuracy of target component OP1 by regularly repeating the process. As described above, correction amount CA1 calculated by correction amount calculation section 42 is used in the mounting process of board product 900 to be produced later.

In a case in which correction amount calculation section 42 calculates correction amount CA1 based on one board 90, correction amount CA1 calculated by correction amount calculation section 42 can be applied from board product 900 to be produced immediately after board 90. In addition, as in the present embodiment, in a case in which board work line WML includes multiple component mounting machines WM3, board product 900 is often continuously produced.

In this case, even in a case in which correction amount CA1 is calculated based on one board 90, correction amount CA1 calculated by correction amount calculation section 42 can be applied from board product 900 to be produced after the mounting process of multiple board products 900. In addition, in a case in which correction amount CA1 is calculated based on multiple boards 90, correction amount CA1 calculated by correction amount calculation section 42 can be applied from board product 900 to be produced after the mounting process of multiple board products 900.

In addition, for example, multiple components 91 to be mounted on one board 90 may deviate, as a whole, from target mounting position RF1 by a predetermined amount in a predetermined direction. In this case, correction amount calculation section 42 can also estimate correction amount CA1 of component 91 other than target component OP1 based on correction amount CA1 calculated for target component OP1. Correction amount calculation section 42 can, for example, set an average value of correction amounts CA1 calculated for target component OP1 as correction amount CA1 for component 91 other than target component OP1.

Then, mounting process section 44 can perform the mounting process by using correction amount CA1 calculated by correction amount calculation section 42 regardless of whether it is the mounting process of target component OP1. In this case, permission section 43 allows the use of correction amount CA1 calculated by correction amount calculation section 42 in the mounting process of all components 91.

2. Correction Amount Calculation Method and Component Mounting Method

The above description of correction amount calculation device 40 can be similarly applied to the correction amount calculation method. Specifically, the correction amount calculation method is a correction amount calculation method applied to board work line WML including component mounting machine WM3, reflow furnace WM4, and appearance inspection machine WM5, and includes a selection step and a correction amount calculation step. The selection step corresponds to the control performed by selection section 41. The correction amount calculation step corresponds to the control performed by correction amount calculation section 42. Further, it is preferable that the correction amount calculation method further include a permission step. The permission step corresponds to the control performed by permission section 43. It should be noted that the component mounting method includes a mounting process step. The mounting process step corresponds to the control performed by mounting process section 44. It should be noted that the permission step can be included in the component mounting method.

3. Example of Effects of Embodiment

With correction amount calculation device 40, in board work line WML in which appearance inspection machine WM5 is provided at the subsequent stage of reflow furnace WM4, selection section 41 and correction amount calculation section 42 are provided. As a result, correction amount calculation device 40 can select target component OP1 in which the movement amount of component 91 in board 90 before and after being conveyed to reflow furnace WM4 is equal to or less than the predetermined allowable value, and calculate the correction amount when selected target component OP1 is mounted. The above description of correction amount calculation device 40 can be similarly applied to the correction amount calculation method.

REFERENCE SIGNS LIST

40: correction amount calculation device, 41: selection section, 42: correction amount calculation section, 43: permission section, 90: board, 91: component, 92: solder, 900: board product, OP1: target component, RF1: target mounting position, MP1: mounting position, MA: positional deviation amount, CA1: correction amount, ID1: board identification information, PT1: component type, WM3: component mounting machine, WM4: reflow furnace, WM5: appearance inspection machine, WML: board work line

The invention claimed is:
1. A correction amount calculation device of a board work line that includes a component mounting machine that performs a mounting process of mounting a component on a board on which solder is printed, a reflow furnace that heats the board on which the component is mounted and melt the solder to perform soldering, and an appearance inspection machine that inspects a mounting position of the component, which is subjected to the soldering, the correction amount calculation device comprising:
control circuitry including:
a selection section that selects a target component in which a movement amount of the component on the board before and after being conveyed to the reflow furnace is equal to or less than a predetermined allowable value, the selection section measuring the movement amount of the component by comparing an inspection result of the appearance inspection machine before and after being conveyed to the reflow furnace and select, as the target component, the component of which the movement amount is equal to or less than the predetermined allowable value; and
a correction amount calculation section that calculates a correction amount, which is used in the mounting process of a board product to be produced later, regarding a positional deviation amount of the mounting position of the target component selected by the selection section with respect to a target mounting position.
2. The correction amount calculation device according to claim 1,
wherein the selection section selects, as the target component, the component in which at least one of volume, mass, and a size of the component is equal to or more than a predetermined threshold value.
3. The correction amount calculation device according to claim 1,
wherein the selection section selects, as the target component, the component designated by a user of the component mounting machine.
4. The correction amount calculation device according to claim 1,
wherein the selection section selects the target component based on a distribution of the movement amounts of the component before and after being conveyed to the reflow furnace, which is acquired in the past.
5. The correction amount calculation device according to claim 1,
wherein the correction amount calculation section stores, regarding multiple boards of the same type, board identification information for identifying the board and the positional deviation amount for each target mounting position of the target component to be mounted on the board in association with each other, and calculate the correction amount for each target mounting position based on a distribution of a predetermined number of the positional deviation amounts for each target mounting position.
6. The correction amount calculation device according to claim 5,
wherein the correction amount calculation section calculates the correction amount when it is determined that the distribution of the positional deviation amounts is in a management state by using a Shewhart control chart.
7. The correction amount calculation device according to claim 1,
wherein the correction amount calculation section stores, regarding multiple boards of the same type, board identification information for identifying the board and the positional deviation amount for each component type of the target component to be mounted on the board in association with each other, and calculate the correction amount for each component type based on a distribution of a predetermined number of the positional deviation amounts for each component type.

8. The correction amount calculation device according to claim 1, further comprising:

a permission section allows use of the correction amount calculated by the correction amount calculation section when the mounting process of the target component is performed, and restrict the use of the correction amount calculated by the correction amount calculation section when the mounting process of the component, which is not the target component, is performed.

9. The correction amount calculation device according to claim 1, wherein the selection section compares a distribution of multiple inspection results of the appearance inspection machine before and after being conveyed to the reflow furnace to select the target component.

* * * * *